(12) United States Patent
Nitta et al.

(10) Patent No.: US 7,541,248 B2
(45) Date of Patent: *Jun. 2, 2009

(54) INTEGRATED SEMICONDUCTOR DEVICE AND METHOD OF MANUFACTURING THEREOF

(75) Inventors: Tetsuya Nitta, Hyogo (JP); Tomohide Terashima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 2 days.

This patent is subject to a terminal disclaimer.

(21) Appl. No.: 11/703,628

(22) Filed: Feb. 8, 2007

(65) Prior Publication Data

US 2007/0148874 A1    Jun. 28, 2007

Related U.S. Application Data

(63) Continuation of application No. 10/625,733, filed on Jul. 24, 2003, now Pat. No. 7,186,623.

(30) Foreign Application Priority Data

Jan. 27, 2003    (JP) .............................. 2003-017109

(51) Int. Cl.
   *H01L 21/336* (2006.01)
(52) U.S. Cl. ...................... 438/309; 438/268; 257/492; 257/493; 257/E21.345; 257/E21.346
(58) Field of Classification Search ................ 438/268, 438/309; 257/492, 493
   See application file for complete search history.

(56) References Cited

U.S. PATENT DOCUMENTS

| | | | |
|---|---|---|---|
| 5,306,656 A | 4/1994 | Williams et al. | |
| 5,548,150 A | 8/1996 | Omura et al. | |
| 5,747,850 A | 5/1998 | Mei | |
| 5,994,756 A | 11/1999 | Umezawa et al. | |
| 6,037,632 A | 3/2000 | Omura et al. | |
| 6,251,730 B1 | 6/2001 | Luo | |
| 6,297,108 B1 | 10/2001 | Chu | |

(Continued)

FOREIGN PATENT DOCUMENTS

EP    452817    10/1991

(Continued)

OTHER PUBLICATIONS

Ludikhuize, et al. "Extended (180V) Voltage in 0.6μm Thin-Layer-SOI A-BCD3 Technology on 1μm BOX for Display, Automotive & Consumer Applications" Proceedings of the 14th International Symposium on Power Semiconductor Devices & ICS, Jun. 4-7, 2002, pp. 77-80, Santa Fe, NM.

*Primary Examiner*—A. Sefer
(74) *Attorney, Agent, or Firm*—McDermott Will & Emery LLP

(57) ABSTRACT

An integrated semiconductor device containing semiconductor elements that have respective desired on-resistances and breakdown voltages achieves appropriate characteristics as a whole of the integrated semiconductor element. The integrated semiconductor device includes a plurality of semiconductor elements formed in a semiconductor layer and each having a source of an n type semiconductor, a drain of the n type semiconductor and a back gate of a p type semiconductor between the source and the drain. At least a predetermined part of the drain of one semiconductor element and a predetermined part of the drain of another semiconductor element have respective impurity concentrations different from each other.

5 Claims, 15 Drawing Sheets

U.S. PATENT DOCUMENTS

| | | |
|---|---|---|
| 6,518,144 B2 * | 2/2003 | Nitta et al. .................. 438/424 |
| 6,610,570 B2 | 8/2003 | Chen |
| 6,614,089 B2 | 9/2003 | Nakamura et al. |
| 6,624,474 B2 | 9/2003 | Kanekawa et al. |
| 6,642,120 B2 | 11/2003 | Terashima |
| 6,650,001 B2 | 11/2003 | Yamaguchi et al. |
| 2002/0005562 A1 | 1/2002 | Kim et al. |
| 2002/0025632 A1 | 2/2002 | Hayashi et al. |
| 2002/0197812 A1 | 12/2002 | Fan |
| 2003/0132450 A1 | 7/2003 | Minato et al. |
| 2003/0148559 A1 | 8/2003 | Onishi et al. |
| 2003/0219945 A1 | 11/2003 | Lee |
| 2003/0227051 A1 | 12/2003 | Kurosaki et al. |
| 2003/0232490 A1 | 12/2003 | Hayashi |

FOREIGN PATENT DOCUMENTS

| | | |
|---|---|---|
| JP | 6-3129618 | 6/1988 |
| JP | 6-97438 | 4/1994 |
| JP | 6-318561 | 11/1994 |
| JP | 11-111855 | 4/1999 |
| JP | 11-238806 | 8/1999 |
| TW | 363267 | 7/1999 |

* cited by examiner 21a 21b
⎿―⎽―⏌
  21

21a 21b
⎿―⎽―⏌
  21

INTEGRATED SEMICONDUCTOR DEVICE AND METHOD OF MANUFACTURING THEREOF

RELATED APPLICATIONS

This application is a continuation of application Ser. No. 10/625,733, filed on Jul. 24, 2003, now U.S. Pat. No. 7,186,623 which in turn claims the benefit of Japanese Application No. 2003-017109, filed on Jan. 27, 2003, the disclosures of which Applications are incorporated by reference herein.

BACKGROUND OF THE INVENTION

1. Field of the Invention

The present invention relates to an integrated semiconductor device containing a plurality of semiconductor elements and a method of manufacturing the integrated semiconductor device. In particular, the present invention relates to an integrated semiconductor device containing multiple types of semiconductor elements with respective breakdown-voltage performances and on-resistances different from each other.

2. Description of the Background Art

As for the conventional MOSFET (Metal-Oxide Semiconductor Field-Effect Transistor), in order to fabricate an IC (Integrated Circuit) containing MOSFETs with different threshold voltages, the IC is structured by being provided with well regions of different impurity concentrations. Specifically, a well region of a MOSFET with a higher threshold voltage has a lower impurity concentration while a well region of a MOSFET with a lower threshold voltage has a higher impurity concentration (Japanese Patent Laying-Open No. 11-111855).

As for MOSFETs used for a liquid-crystal driver for example, a transistor processing a logic signal and a transistor processing an output signal should have different transistor breakdown-voltages respectively. In other words, a MOSFET processing the logic signal has a well region with a relatively high impurity concentration as the MOSFET is driven by a low voltage and should be small in size. On the other hand, a MOSFET processing the output signal has a well region with a relatively low impurity concentration as the MOSFET is driven by a high voltage and accordingly requires a high breakdown voltage (Japanese Patent Laying-Open Nos. 6-318561 and 11-238806).

For the above-discussed IC, wells of two different impurity concentrations respectively are formed by using an implantation mask having its parts with different opening ratios respectively to implant impurities into a semiconductor. After this, annealing is performed to diffuse the implanted impurities thereby producing a uniform concentration in each well. It is apparently seen that the well into which impurities are implanted through the part of the mask having a lower opening ratio has a lower impurity concentration.

The implantation mask having its parts with different opening ratios respectively can thus be used to change the amount of implanted impurities depending on the well to provide different impurity concentrations of the wells for respective semiconductor elements.

Here, what should be considered is the impurity concentration of the well, namely body, of the MOSFET, and relevant characteristics of the MOSFET are (b1) threshold voltage and (b2) breakdown voltage. More specifically, in order to produce MOSFETs that are different in threshold voltage or breakdown-voltage performance, respective concentrations of wells are made different.

It is still required, however, to reduce the on-resistance of each of high breakdown-voltage transistors included in an integrated semiconductor device. Even if the well or body of a high breakdown-voltage transistor is changed in impurity concentration, which has almost no influence on the on-resistance. Then, it has been desired that desirable characteristics of an integrated semiconductor device which has a plurality of high breakdown-voltage elements are ensured by setting both of an appropriate breakdown voltage and an appropriate on-resistance of each high breakdown-voltage transistor element.

SUMMARY OF THE INVENTION

An object of the present invention is to provide an integrated semiconductor device containing a plurality of semiconductor elements and a method of manufacturing the integrated semiconductor device, the integrated semiconductor device having appropriate characteristics as a whole that are achieved by being provided with a proper on-resistance and a proper breakdown-voltage performance of each of those semiconductor elements.

An integrated semiconductor device according to the present invention includes a plurality of semiconductor elements formed in a semiconductor layer and each having a source of a first-conductivity-type semiconductor, a drain of the first-conductivity-type semiconductor and a body region of a second-conductivity-type semiconductor between the source and the drain. At least a predetermined part of the drain of one semiconductor element and a predetermined part of the drain of another semiconductor element are different in impurity concentration.

By the above structure, a semiconductor element of the integrated semiconductor device can have an impurity concentration appropriate for its breakdown voltage. The predetermined part of the drain may be the whole of the drain or a part of the drain. As for the predetermined part of the drain of that one semiconductor element and the predetermined part of the drain of that another semiconductor element, respective drains may have the same shape or similar shapes, and respective positions of the drains may not correspond to each other. Further, the drains may have different shapes.

Although the terms source and drain are used for their corresponding components, the source may alternatively be referred to as emitter or cathode and the drain may alternatively be referred to as collector or anode if the semiconductor element has two pn junctions. In other words, the semiconductor element is not limited to a semiconductor element having components referred to as source and drain, but includes semiconductor elements having components referred to as emitter, cathode, collector and anode. The body region mentioned above may have any designation, backgate for example, if the semiconductor element has its source and drain of different conductivity types respectively.

A method of manufacturing an integrated semiconductor device according to the present invention is a method of manufacturing an integrated semiconductor device having a plurality of semiconductor elements formed in a semiconductor layer and each having a source of a first-conductivity-type semiconductor, a drain of the first-conductivity-type semiconductor and a body region of a second-conductivity-type semiconductor between the source and the drain. The method includes the step of implanting impurities concurrently into at least a predetermined part of the drain of one semiconductor element and into a part of the drain of another semiconductor element, an implantation mask being used that includes a portion corresponding to the drain of that one semiconductor element and having a first opening ratio as well as a portion corresponding to the drain of that another semiconductor element and having a second opening ratio different from the first opening ratio, and the step of annealing the integrated semiconductor device after the step of implanting impurities to diffuse the impurities.

According to the method above, in one step of implanting impurities, respective impurity concentrations of semiconductor elements having different breakdown voltages are adjusted to achieve an integrated semiconductor device having a proper trade-off characteristic between the on-resistance and the breakdown voltage of each semiconductor element. Moreover, in such a heat-treatment step as annealing step, the integrated semiconductor device in the intermediate steps of the manufacturing process is annealed and thus the one semiconductor element and another semiconductor element are annealed concurrently in the process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described in connection with the drawings.

First Embodiment-Theoretical Background

Figure 1:
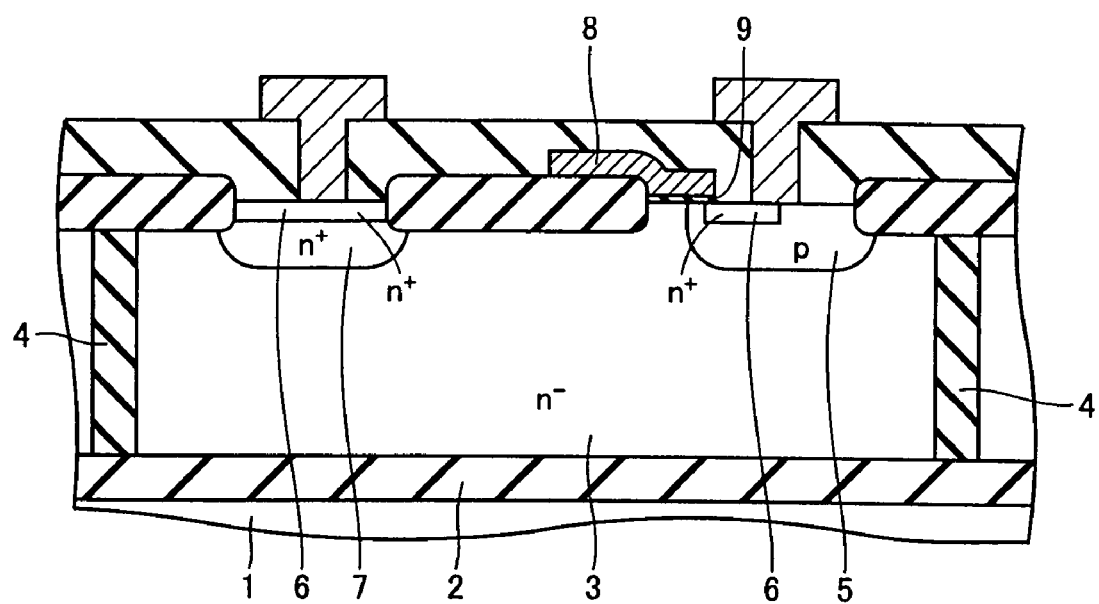
FIG. 1 illustrates a theoretical background of the present invention.

Each of transistor elements contained in an IC has following characteristics in order to achieve both of a desirable on-resistance and a desirable breakdown-voltage performance. FIG. 1 is a cross sectional view of a transistor element, illustrating a theoretical background of the present invention. For the convenience of description, an n type transistor element formed, for example, on an SOI (Silicon On Insulator) substrate formed of a silicon substrate 1 and an insulating film 2 provided thereon is described.

On insulating film 2 of the SOI substrate, an $n^-$ type Si layer (drain drift region) 3 surrounded by a trench isolation oxide film 4 is provided, and each of regions of the transistor is formed thereon. In a surface layer of the $n^-$ type Si layer, a source 6 and a drain (drain convergence region) 7 that are both $n^+$ type diffusion regions are spaced apart from each other. A back gate 5 which is a p type diffusion region is provided to enclose source 6 from the inside of the $n^{31}$ type Si layer. This structure of the back gate facilitates fabrication of the transistor element having a reduced channel region. In this structure, an npn structure is formed that is constituted of $n^+$ type source 6, p type back gate 5 and $n^-$ type Si layer (drain drift region) 3 and $n^+$ drain (drain convergence region) 7. The drain is formed of $n^-$ type drain drift region 3 and drain convergence region 7 which contains n type impurities of a higher concentration than that of the drift region and has a contact therein.

On the surface of $n^-$ type Si layer 3 between source 6 and drain convergence region 7, a gate insulating film 9 is placed on which a gate electrode 8 is provided.

N type transistor element 50a discussed above may be varied in breakdown voltage by changing the distance between the source and the drain convergence region. In particular, when the impurity concentration of the drain drift region satisfies the RESURF condition, the drain drift region is often used under the RESURF condition since a higher breakdown voltage is readily achieved. Here, RESURF condition means that an impurity concentration which allows the $n^-$ type drain drift region to be depleted completely is satisfied. The RESURF condition is fulfilled when, for example, a relation $N \cdot d = 1E12$ cm$^{-2}$ is satisfied, where N denotes a concentration of n type impurities in the $n^-$ type drain drift region and d denotes a thickness of the $n^-$ type drain drift region. In the following description, $N \cdot d$ may be referred to as concentration for the sake of convenience. Therefore, concentration herein refers to $N \cdot d$ in some cases.

There may be cases where the drain drift region having any concentration except for the RESURF concentration is used. In any case, elements having respective breakdown voltages different from each other are often produced by providing respective drain regions of different lengths while the impurity concentration is kept constant.

Such a method of achieving elements having different breakdown voltages by providing different distances between the source and drain without changing the impurity concentration of the n⁻ type well layer is not the most desirable method in terms of the on-resistance for the following reason. For example, suppose that the RESURF condition is maintained, then, the on-resistance (effective on-resistance) can be represented by following formulas (1) and (2) by analytical calculation:

$$R_{on} \cdot S \propto V_b^{7/3} \quad (1)$$

$$N \cdot d = \text{approximately } 1E12 \quad (2)$$

where $R_{on} \cdot S$ denotes an effective on-resistance which is an on-resistance per unit area of an element, Vb denotes a breakdown voltage of the element, N denotes an impurity concentration of n⁻ type Si layer (drain drift region) 3, and d denotes a thickness of n⁻ type Si layer (drain drift region) 3.

If the impurity concentration of n⁻ type Si layer (drain drift region) is changed according to the breakdown voltage, the on-resistance can be represented by following formulas (3) and (4) called silicon limit.

$$R_{on} \cdot S \propto V_b^{11/3} \quad (3)$$

$$N \propto V_b^{-4/3} \quad (4)$$

It is seen from formulas (1) and (3) above that impurity concentration N of drain drift region 3 can be changed according to the breakdown voltage to decrease the effective on-resistance more sharply with the decrease of the breakdown voltage. For example, if the thickness of drain drift region 3 is 5 μm (d=5 μm), the effective on-resistance is lower than that under the RESURF condition for a breakdown voltage of approximately 87.5 V or less. Here, the voltage of 87.5 V is a voltage for the above dimension and would change depending on the dimension.

It is seen from the evaluation above that it is proper (a) to use an impurity concentration of the drain drift region in proportion to $V_b^{-4/3}$ for a transistor of a predetermined breakdown voltage or less and (b) to use a drain drift region satisfying the RESURF condition (N·d=1E12 cm⁻²) for a transistor of a breakdown voltage higher than the predetermined breakdown voltage.

Figure 2A:
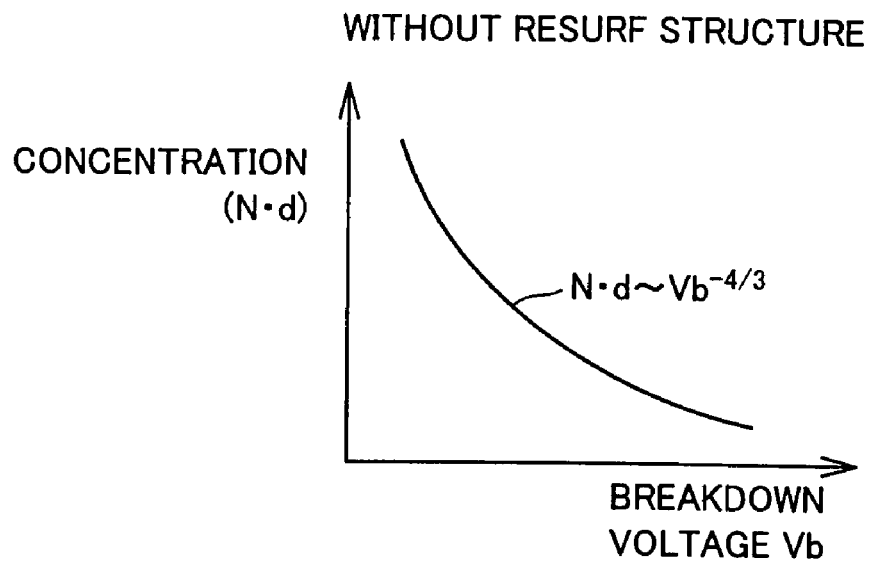
FIG. 2A shows a relation between an impurity concentration N and a breakdown voltage Vb of a drain drift region without using the RESURF structure and FIG. 2B shows a relation between an impurity concentration N and a breakdown voltage Vb of the drain drift region when the RESURF structure is used.
Figure 2B:
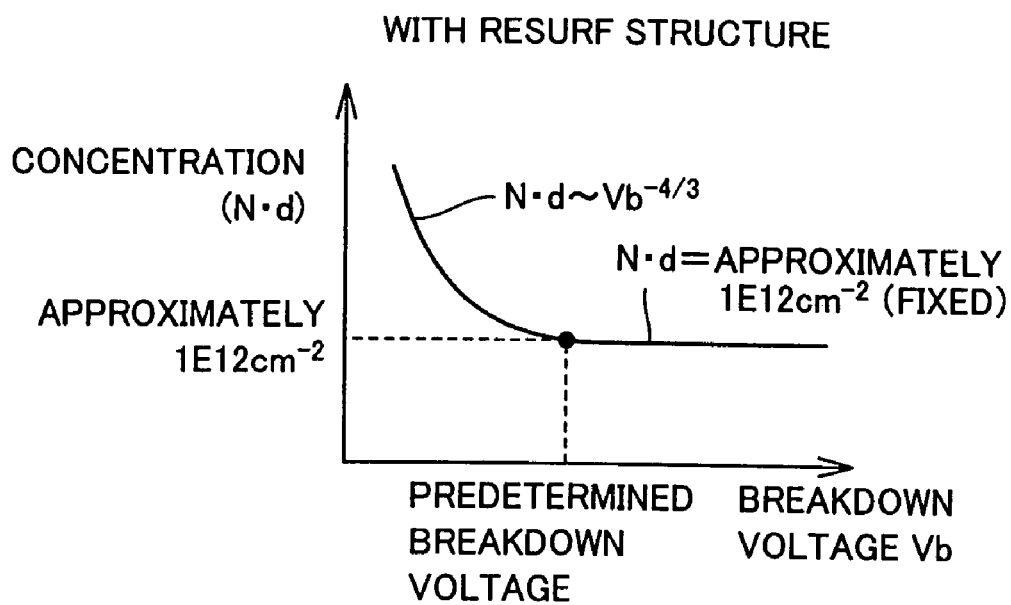

It is not necessarily required to use the RESURF structure as discussed above. FIG. 2A shows a relation between impurity concentration N of the drain drift region and breakdown voltage Vb when the RESURF structure is not employed. When the RESURF structure is not used, impurity concentration N and breakdown voltage Vb satisfy the relation defined by formula (4) for decreasing on-resistance. FIG. 2B shows a relation between impurity concentration N and breakdown voltage Vb when the RESURF structure is used. As shown in FIG. 2B, for a semiconductor element having its breakdown voltage less than a predetermined breakdown voltage, it is more appropriate to increase the impurity concentration of the drain drift region as compared with increase of the RESURF concentration. If all semiconductor elements each have a breakdown voltage of the predetermined one or more, it is appropriate to set the impurity concentration of the drain drift regions all to the RESURF concentration. In this case, it is unnecessary to provide different impurity concentrations respectively for all drain drift regions of semiconductor elements.

On the contrary, if all semiconductor elements have respective breakdown voltages less than the predetermined breakdown voltage, the on-resistance can be decreased to a greater degree when the impurity concentration is made higher than the RESURF concentration even for a semiconductor element having the greatest breakdown voltage. Then, except for the case where all of the elements have the predetermined breakdown voltage or more, transistor elements having respective breakdown voltages different from each other cannot have an optimum on-resistance if the drain drift region of a certain impurity concentration is merely used.

As discussed above, it is clear that, for transistor elements having respective breakdown-voltage performances different from each other, the on-resistance can be reduced to a greater degree by using drain drift regions 3 of different impurity concentrations respectively. Further, as described above, an appropriate annealing condition can be selected after impurity implantation from the surface of the semiconductor layer to increase the impurity concentration in only a region near the surface layer of the semiconductor layer to allow the impurity concentration at a location in the surface layer to become lower as the location approaches the inside. In this way, the on-resistance can be reduced to a higher degree and the breakdown voltage performance can be improved in some cases.

Second Embodiment

Figure 3:
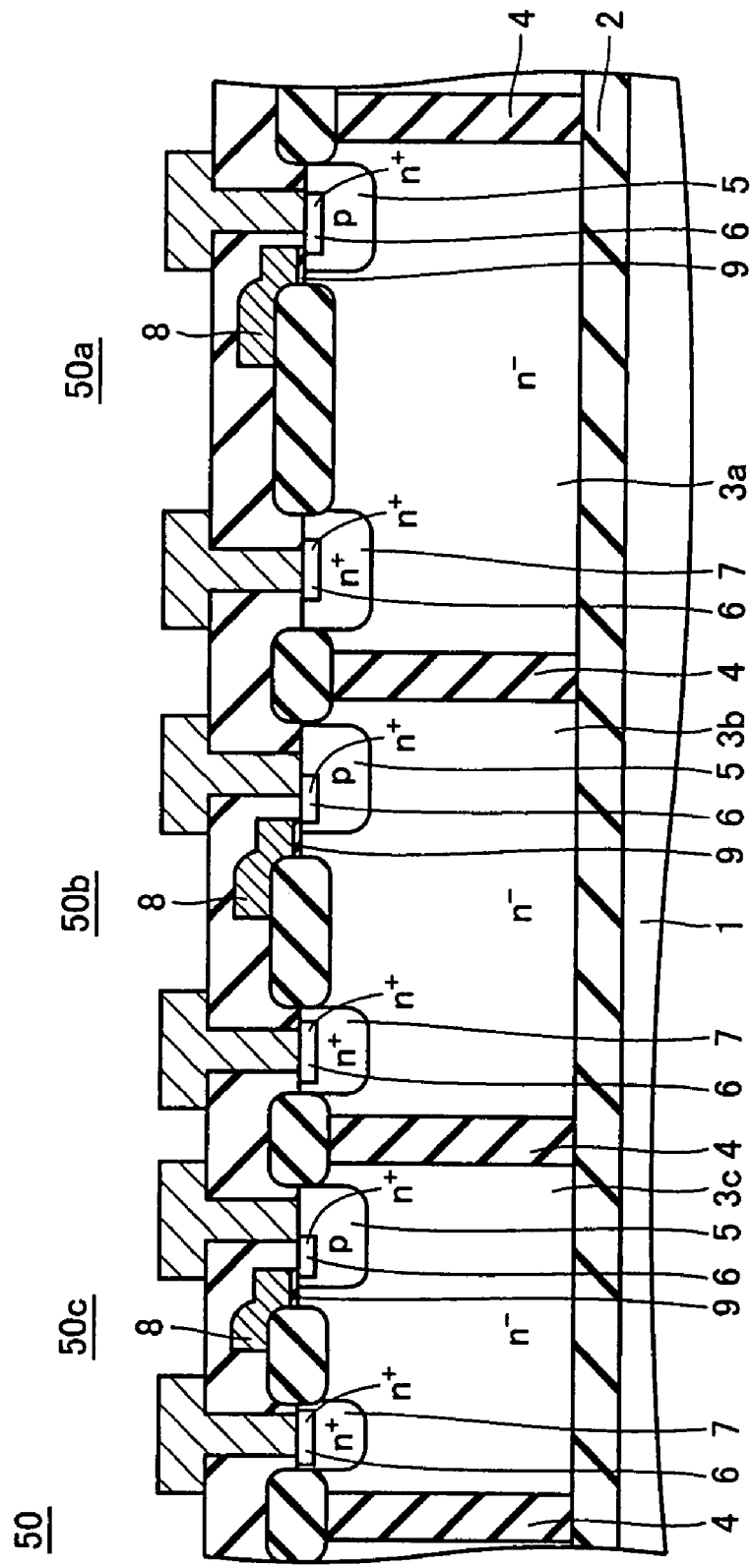
FIGS. 3 to 5 respectively show cross-sectional views of respective integrated semiconductor devices according to second to fourth embodiments of the present invention.

In FIG. 3, a BOX layer (Buried Oxide Layer) 2 is provided on an Si substrate 1 and, on BOX layer 2, n⁻ type drain drift regions 3a, 3b and 3c are formed. As for the n type impurity concentration of n⁻ type drain drift regions 3a, 3b and 3c, there is a relation 3a<3b<3c where 3a, 3b and 3c indicate respective impurity concentrations of drain drift regions 3a, 3b and 3c. These n⁻ type semiconductor layers 3a, 3b and 3c form drain drift regions. In other words, one drain drift region and the other drain drift region correspond to any two of these n⁻ type semiconductor layers 3a, 3b and 3c. According to this embodiment, respective impurity concentrations of these drain drift regions are made different from each other to adjust the concentrations to optimum concentrations for transistor elements 50a, 50b and 50c.

In a surface layer of n⁻ type drain drift regions 3a, 3b and 3c, a source 6 and a drain convergence region 7 that are both n⁺ diffusion regions are spaced apart. A back gate 5 which is a p type diffusion region is provided to enclose source 6 from the inside. In this structure, an npn structure is formed that is constituted of n⁺ type source 6, p type back gate 5 and n⁻ type drain drift regions 3a, 3b and 3c as well as n type drain convergence region 7.

On the surface of back gate 5, a gate electrode 8 of a conductive layer is provided with a gate insulating film 9 therebetween. An n type MOS transistor (Metal Oxide Transistor) having back gate 5, source 6, drains 7, 3a, 3b, 3c and gate electrode 8 as its components is thus formed.

For transistors 50a, 50b and 50c having respective breakdown voltages different from each other, respective on-resistances can appropriately be set by making respective n type impurity concentrations of the drain drift regions different from each other. In general, preferably an element having a high breakdown voltage has a low concentration of n type impurities while an element having a relatively lower breakdown voltage has a relatively higher concentration of n type impurities.

Respective N type impurity concentrations of drain drift regions 3a, 3b and 3c of transistor elements 50a, 50b and 50c can be set to optimum concentrations appropriate for respective breakdown voltages of the elements and accordingly a low on-resistance is achieved. Such an effect is obtained not only for an integrated semiconductor device using an SOI substrate but also for the usual semiconductor device having an n⁻ semiconductor layer on a p type substrate that is divided by a p type diffusion layer.

In addition, for a silicon region surrounded by an element isolation oxide film, a trench isolation 4 provides an advantage that interference of concentrations with each other due to diffusion in the lateral direction (direction parallel to the surface of the substrate) is prevented.

Third Embodiment

Figure 4:
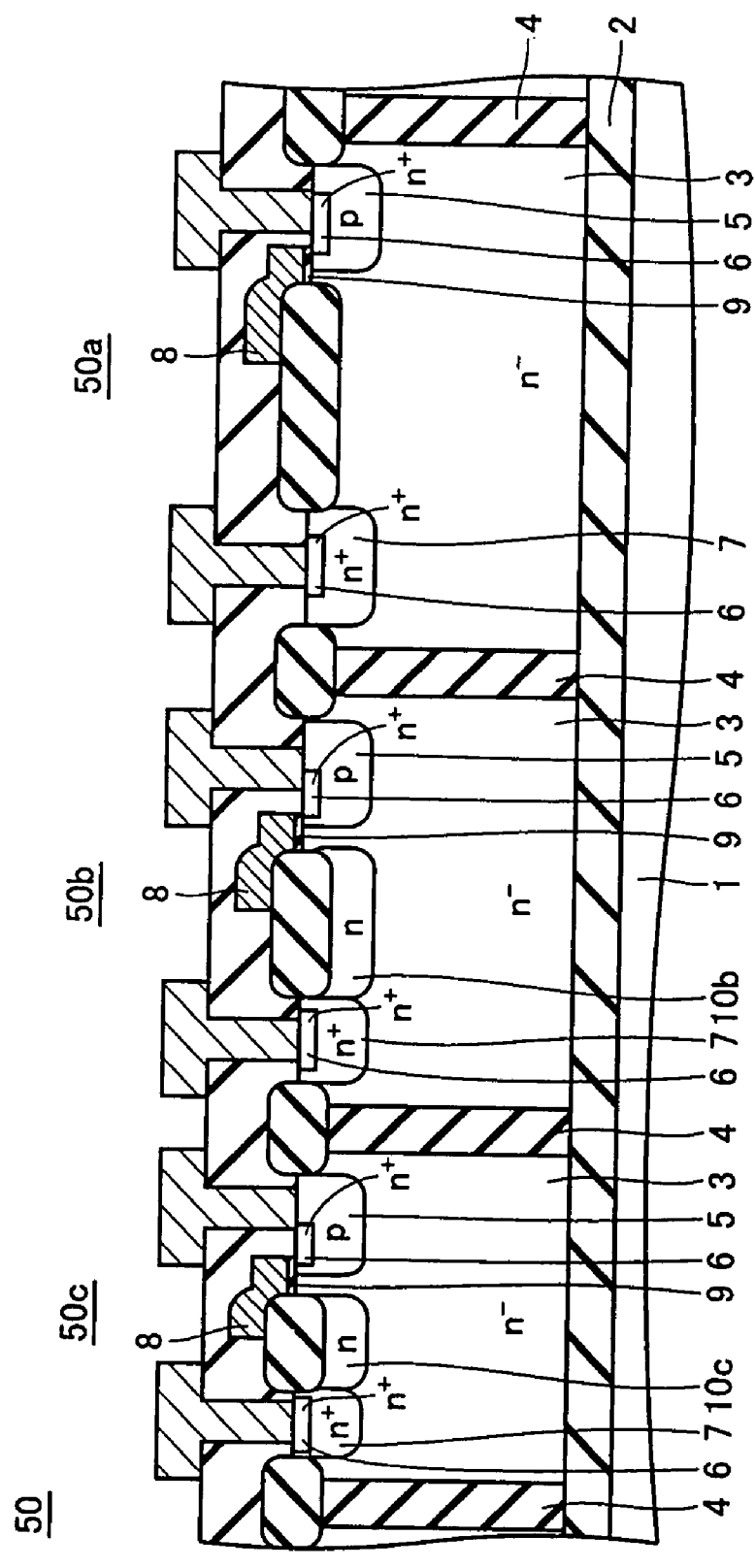

In FIG. 4, a BOX layer (Buried Oxide Layer) 2 is provided on an Si substrate 1 and an n⁻ type drain drift region 3 is formed on BOX layer 2. A back gate 5 of a p type semiconductor, a source 6 and a drain convergence region 7 that are both of n⁺ type, a gate electrode 8 and an underlying gate insulating film 9 are identical to those of integrated semiconductor device 50 in FIG. 3.

One feature of an integrated semiconductor device in FIG. 4 is that, in the region between back gate 5 and drain convergence region 7 in drain drift region 3, i.e., in a drain drift layer, an n type drain drift layer 10b containing n type impurities of a higher concentration than that of n⁻ type drain drift region 3 is provided in transistor 50b, and an n type drain drift layer 10c containing n type impurities of a higher concentration than that of n type drain drift layer 10b is provided in transistor 50c. The corresponding region in transistor 50a contains n type impurities of the concentration of n⁻ type drain drift region 3. The above-mentioned region between back gate 5 and drain convergence region 7 may alternatively be referred to as a surface layer of drain drift region 3 between back gate 5 and drain convergence region 7.

In the integrated semiconductor device shown in FIG. 4, transistor 50a has the highest breakdown voltage, and transistor 50b and transistor 50c have the second highest and the third highest breakdown voltages respectively. For transistors 50b and 50c, n type drain drift layers 10b and 10c suitable for respective breakdown performances of those elements (transistors) are provided. As for transistors 50a, 50b and 50c, a relation therebetween with respect to the impurity concentration of the drain drift layers is represented by: n⁻ type drain drift region 3<n type drain drift layer 10b<n type drain drift layer 10c, and thus the highest impurity concentration is of n type drain drift layer 10c.

The impurity concentration of the drain drift layer can be adjusted for each of the transistor elements to provide a high breakdown characteristic to a transistor requiring a high breakdown performance and provide a low on-resistance to a transistor element for which decrease of the on-resistance is more important than the breakdown performance. In this way, a proper breakdown characteristic and a low on-resistance can be obtained for the integrated semiconductor device.

Fourth Embodiment

Figure 5:
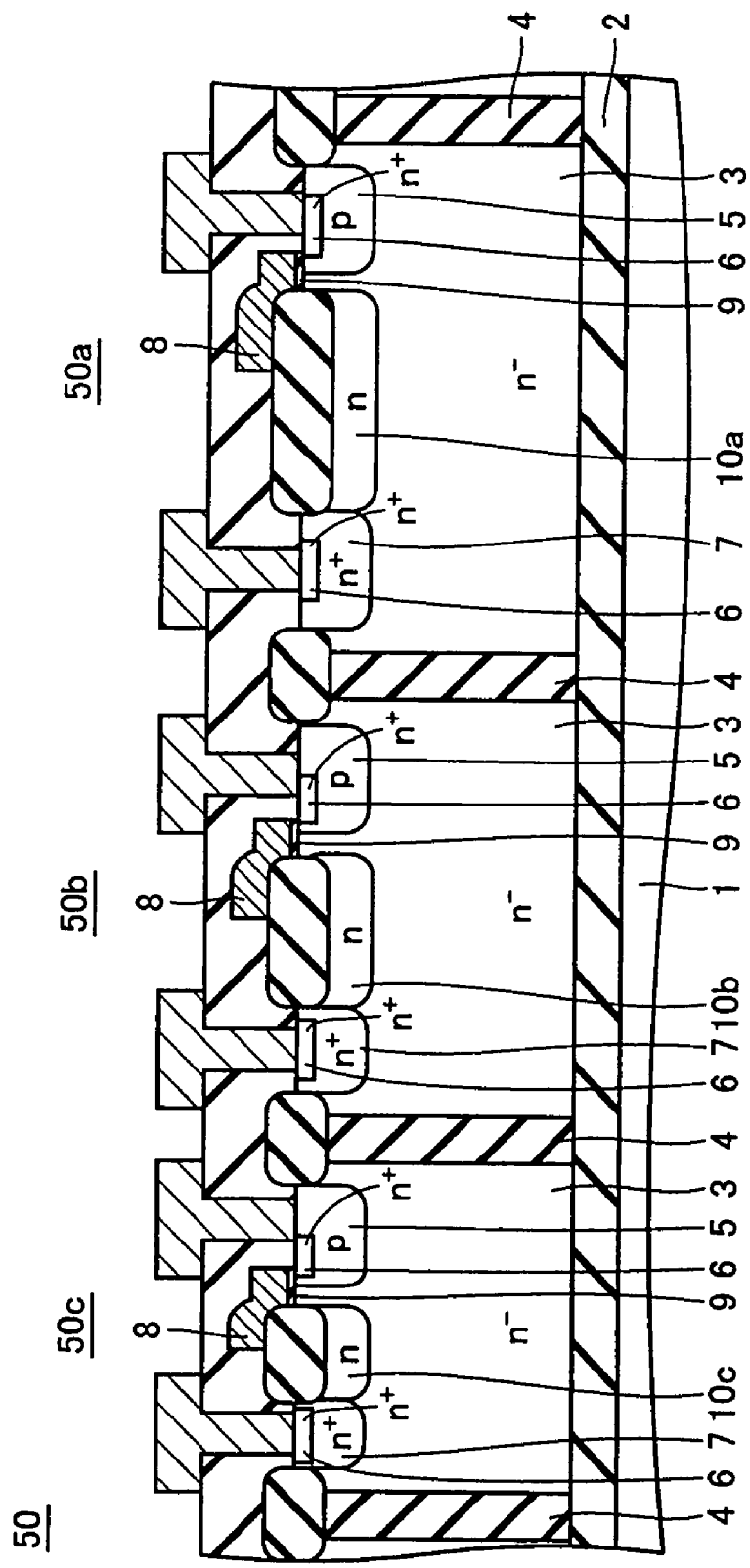

As shown in FIG. 5, one feature of this embodiment is that, respective drain drift regions of the elements including an element of the maximum breakdown voltage are formed of drain drift layers 10a, 10b and 10c. Other components are similar to those of the structure of the third embodiment. A relation with respect to the concentration of n type impurities is represented by: drain drift region 3≦drain drift layer 10a≦drain drift layer 10b≦drain drift layer 10c, where drain drift layer 10c contains n type impurities of the highest concentration. Accordingly, the on-resistance of transistors 50a, 50b and 50c can be set to meet a relation: 50a≧50b≧50c, where the on-resistance is lowest for transistor 50c.

As discussed in connection with the structure of transistors 50a, 50b and 50c in FIG. 4, the drain drift layer is unnecessary for the element having the highest breakdown voltage under the condition that the impurity concentration of the substrate is suitable for the highest breakdown voltage. In this case, a shallow drain drift region of a high impurity concentration has a current path which is more linear than that in a deep drain drift region of a low impurity concentration, and thus a lower on-resistance can be achieved. Moreover, the impurity concentration directly below the body can be made low, and thus an advantage can be obtained that concentration of charges directly below the body can be prevented and accordingly improvement of the breakdown voltage is readily achieved.

Fifth Embodiment-Overview of Manufacturing Method

Drain drift layers having respective impurity concentrations different from each other can be formed by ion implantation of n type impurities. In particular, mesh implantation as described below is preferably used that facilitates the manufacturing process. Usually, when n⁻ type drain drift region is to be formed by impurity implantation, a layer of a desired impurity concentration can be produced by implanting impurities into the entire part which needs implantation in the n⁻ type drain drift region, with the amount of implanted ions being adjusted. In this case, if different impurity concentrations are required for respective elements, the photolithography step and the implantation step have to be repeated for the number of different impurity concentrations, resulting in an increase of the process steps which is not preferable.

In order to overcome this problem, ion implantation is done not for the entire area of the drain drift layer, but by using a mesh or stripe mask having openings and masking portions arranged at a short pitch to perform partial ion implantation into a region which needs implantation in the drain drift layer. In this case, immediately after the ion implantation, the density of impurities is not uniform depending whether implanted by means of the masking portion or the opening. After the implantation, however, sufficient annealing (diffusion) can be added to make impurities uniform. Then, the result of implantation corresponds to implantation with an amount of impurities which is smaller than the actual amount of implanted impurities. Different impurity concentrations for respective drain drift layers of transistor elements can be achieved by one implantation, and thus the on-resistance can readily be optimized for elements of various breakdown voltages that are contained in an IC.

Sixth Embodiment

Figure 6:
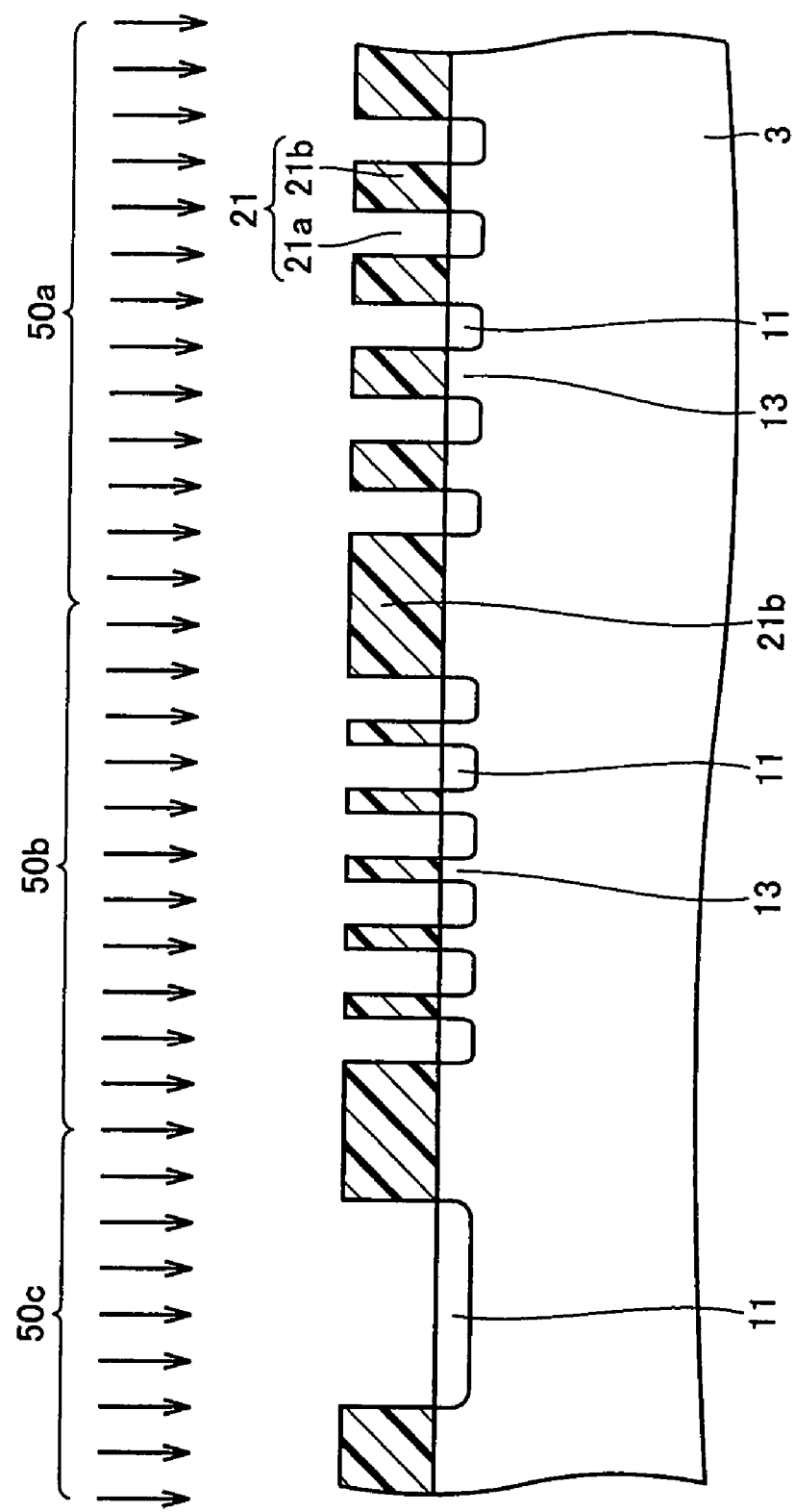
FIG. 6 shows a state in which impurities are implanted according to a method of manufacturing an integrated semiconductor device in a sixth embodiment of the present invention.
Figure 7:
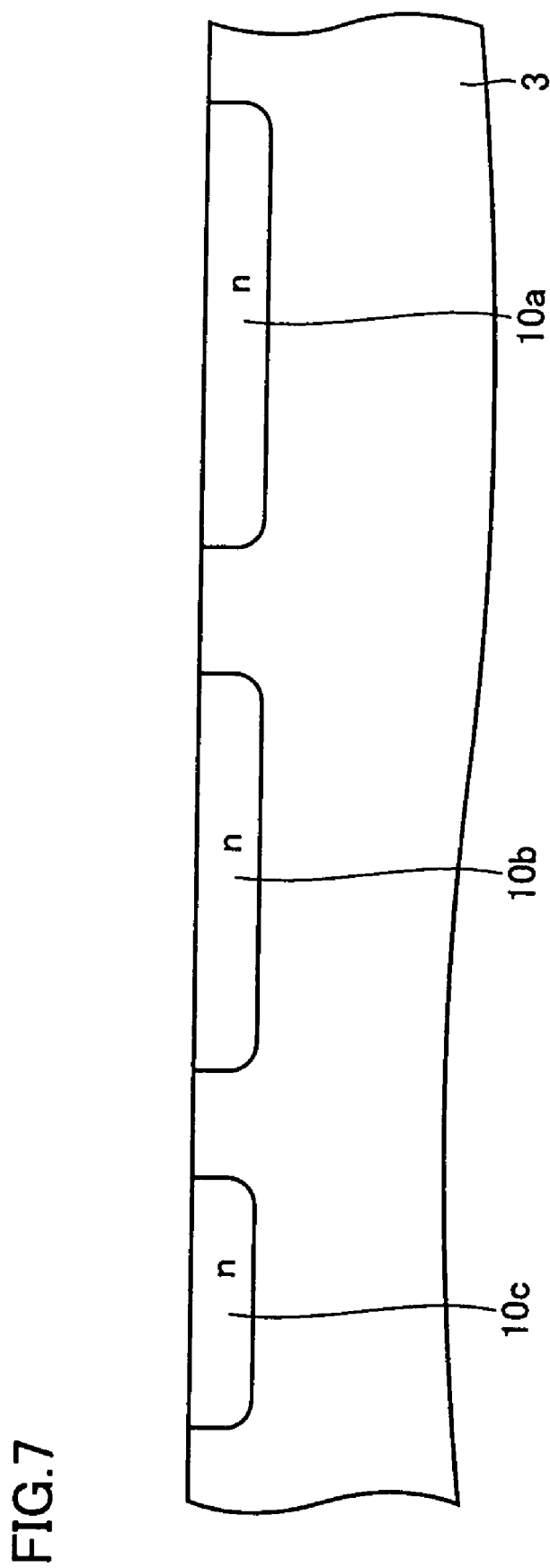
FIG. 7 shows a state in which annealing is performed after the step of impurity implantation shown in FIG. 6.

According to a sixth embodiment of the present invention, an exemplary method of manufacturing the integrated semiconductor device (FIG. 5) illustrated in connection with the fourth embodiment is described. According to this embodiment, implantation is done for n type drain drift layers 10a, 10b and 10c in the same implantation step. Different concentrations for respective n type diffusion layers are achieved by adjustment of the opening area or opening ratio. Specifically, a stripe or mesh resist mask 21 is used as shown in FIG. 6 to implant impurities. The impurity concentration is low in a semiconductor surface layer 13 corresponding to mask portion 21b while the impurity concentration is high in a semiconductor surface layer 11 corresponding to opening 21a. In FIG. 6, the average impurity concentration of semiconductor surface layers respectively of transistors 50a, 50b and 50c has a relation: 50a<50b<50c, which means the average impurity concentration of transistor 50c is the highest. Then, as shown in FIG. 7, annealing is done to make the concentration of the implanted part and non-implanted part uniform.

According to the above-discussed method, one implantation step can be used to implant a desired amount of impurities into each of predetermined portions into which different amounts of impurities are to be implanted, and thus the additional process steps can be made minimum. The method above is applicable to the third embodiment to form drain drift layers 10b and 10c in manufacturing the integrated semiconductor device, by, for example, providing no opening for the region of transistor 50a. Moreover, in manufacturing the integrated semiconductor device of the second embodiment, n⁻ type drain drift regions 3a, 3b and 3c having different impurity concentrations respectively can be formed by sufficient annealing after the impurity implantation to diffuse the impurities to deeper positions.

Figure 8:
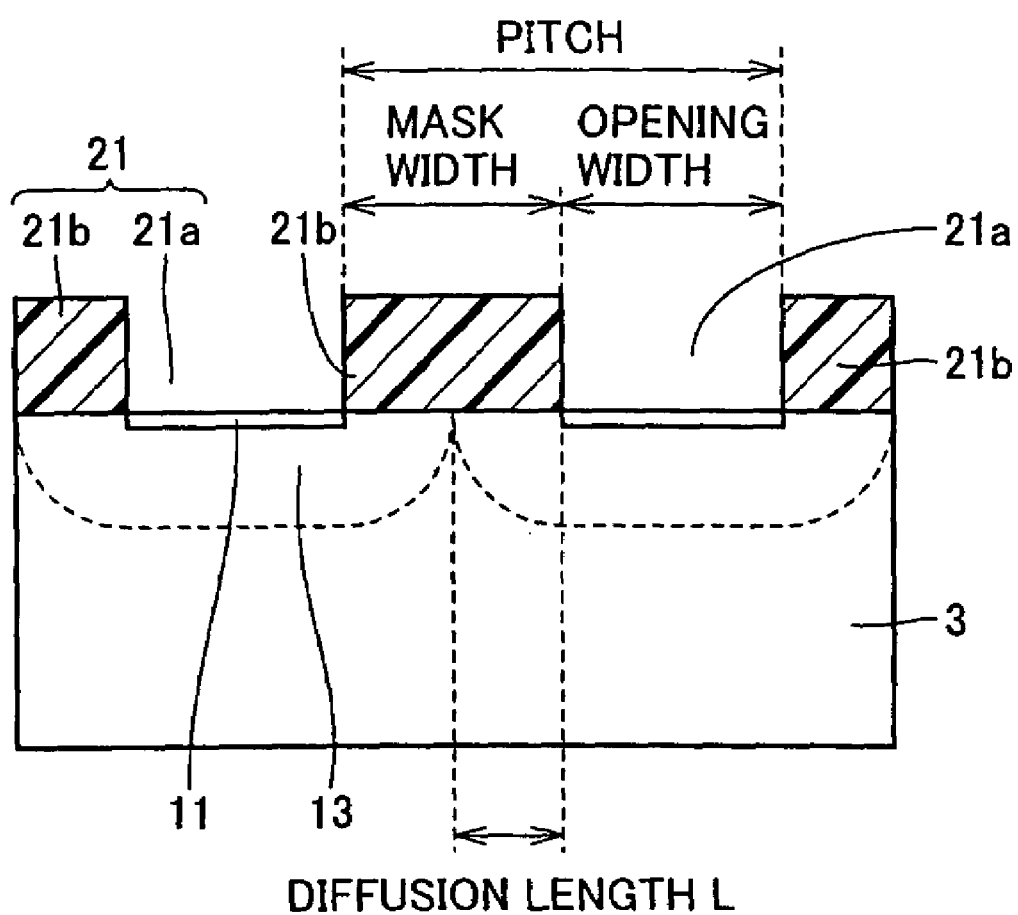
FIG. 8 show specific parts of an implantation mask.

As for the implantation mask, when implantation mask 21 like a resist mask having openings at a predetermined pitch is used, openings of the mask that are too large would produce a concentration profile equivalent to that of the usual one dimensional diffusion. In other words, different impurity concentrations for respective transistors cannot be obtained. On the contrary, if the masking portions of the mask are too large, diffused regions do not connect to each other and thus the non-implanted region remains as it is having a low impurity concentration. The size of the opening portion and that of the masking portion of the mask pattern are preferably as small as possible. Here, as shown in FIG. 8, a diffusion length is defined as a distance L where the concentration of diffused impurities is equal to the concentration of the substrate. FIG. 8 shows a relation between the opening width, the mask width, the opening pitch and diffusion length L. According to the definition above, it is necessary that the following relations are fulfilled.

Opening width<2L  (5)

Mask width<2L  (6)

Pitch<4L  (7)

Any mask satisfying arbitrary two of the above relations or satisfying all of the relations may be used.

Figure 9:
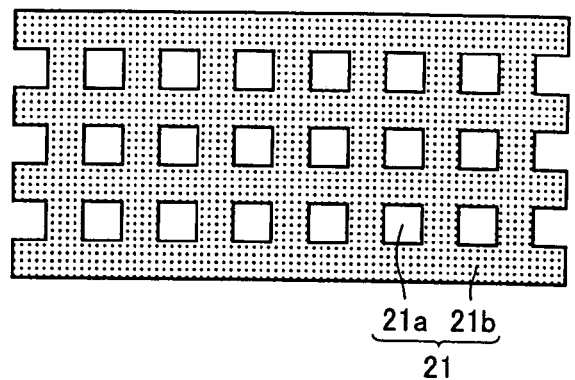
FIG. 9 shows a mesh-like implantation mask having rectangular openings.
Figure 10:
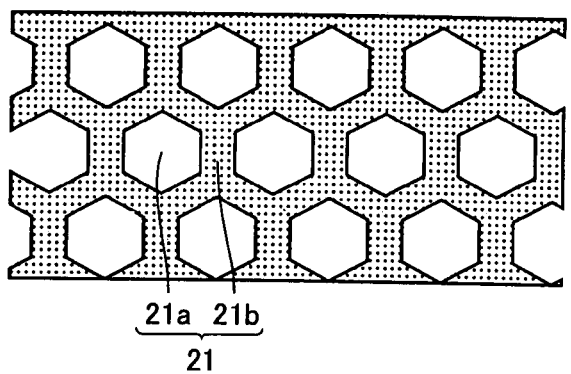
FIG. 10 shows a mesh-like implantation mask having hexagonal openings.

Available mesh patterns are a rectangular mesh mask as shown in FIG. 9 and a hexagonal mesh mask (honeycomb mask) as shown in FIG. 10. The mesh pattern is not limited to these two types and may have circular openings, polygonal openings or openings defined by a curved line.

Figure 11A:
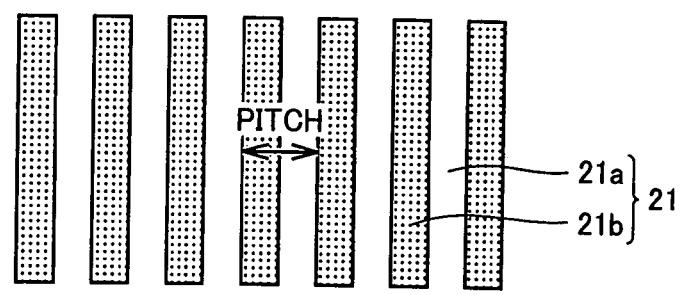
FIGS. 11A and 11B each show a stripe implantation mask.
Figure 11B:
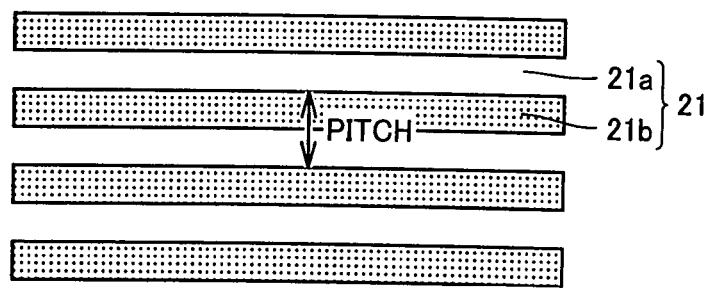

In addition, stripe resist masks as shown in FIGS. 11A and 11B may be used. For the lateral transistors shown in FIGS. 1-5, the direction in which the current flows changes at an end, for example, of the transistor. Therefore, if the stripe mask is used to produce a stripe concentration distribution, the concentration distribution causes anisotropy in terms of resistance, which is likely to adversely affect the breakdown voltage. However, the direction of stripes can be made parallel to the direction connecting the source and drain of the transistor to obtain a uniform concentration in a current path, in an ON state, in the direction of the current. Then, a low on-resistance can be achieved.

Seventh Embodiment

According to a seventh embodiment of the present invention, a dot mask having an increased opening ratio is described. Although the mesh implantation mask of the sixth embodiment is suitable for ensuring uniformity of the impurity concentration, the mesh mask having an increased opening ratio for decreasing the effective amount of implantation consequently has a too small resist width and thus photolithography by means of this mask could be impossible.

Referring to FIGS. 9-11, the opening ratio for each of the shapes of openings is defined as follows, where the opening pitch is 1 and (mask width/opening pitch)=x (<1).

Stripe mask: opening ratio=1−x

Mesh mask: opening ratio=K $(1-x)^2$ where K=1 for mesh masks having rectangular openings and hexagonal openings and K=π/4 for the mesh mask having circular openings.

It is seen from evaluation of the above opening ratio that the opening ratio of the mesh mask is more difficult to increase as compared with the stripe mask. Then, in order to increase the opening ratio of the mesh mask, the through portions (openings) and the remaining portions (masking portion or blocking portion) of the mask are replaced with each other to produce a dot mask to achieve an increase of the opening ratio while the uniformity of the concentration is maintained.

Figure 12:
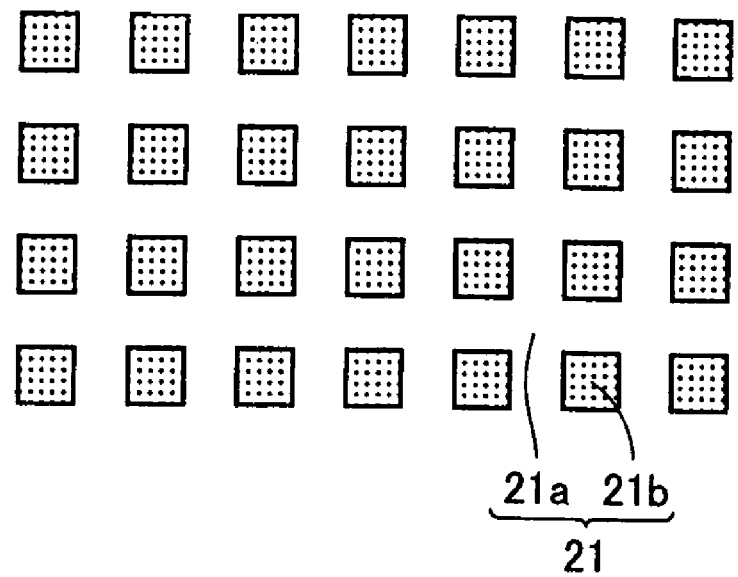
FIG. 12 shows a dot implantation mask having rectangular masking portions with an opening surrounding the masking portions.
Figure 13:
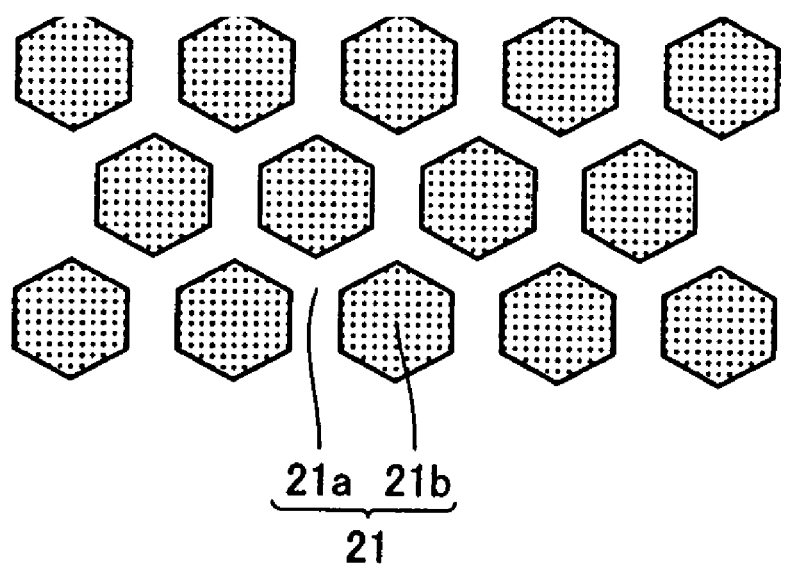
FIG. 13 shows a dot implantation mask having hexagonal masking portions with an opening surrounding the hexagonal masking portions.

FIGS. 12 and 13 each show a resist pattern (mask pattern) of the dot mask. The opening ratio of the dot masks each is represented as follows.

Dot mask: opening ratio=1−$K^2$ where K=1 for dot masks having rectangular and hexagonal masking portions and K=π/4 for the mesh mask having circular masking portions. This dot mask achieves the highest opening ratio when the masking width (width of the blocking or resist portion) is the same, while maintaining the uniformity of concentration.

Eighth Embodiment

Figure 14:
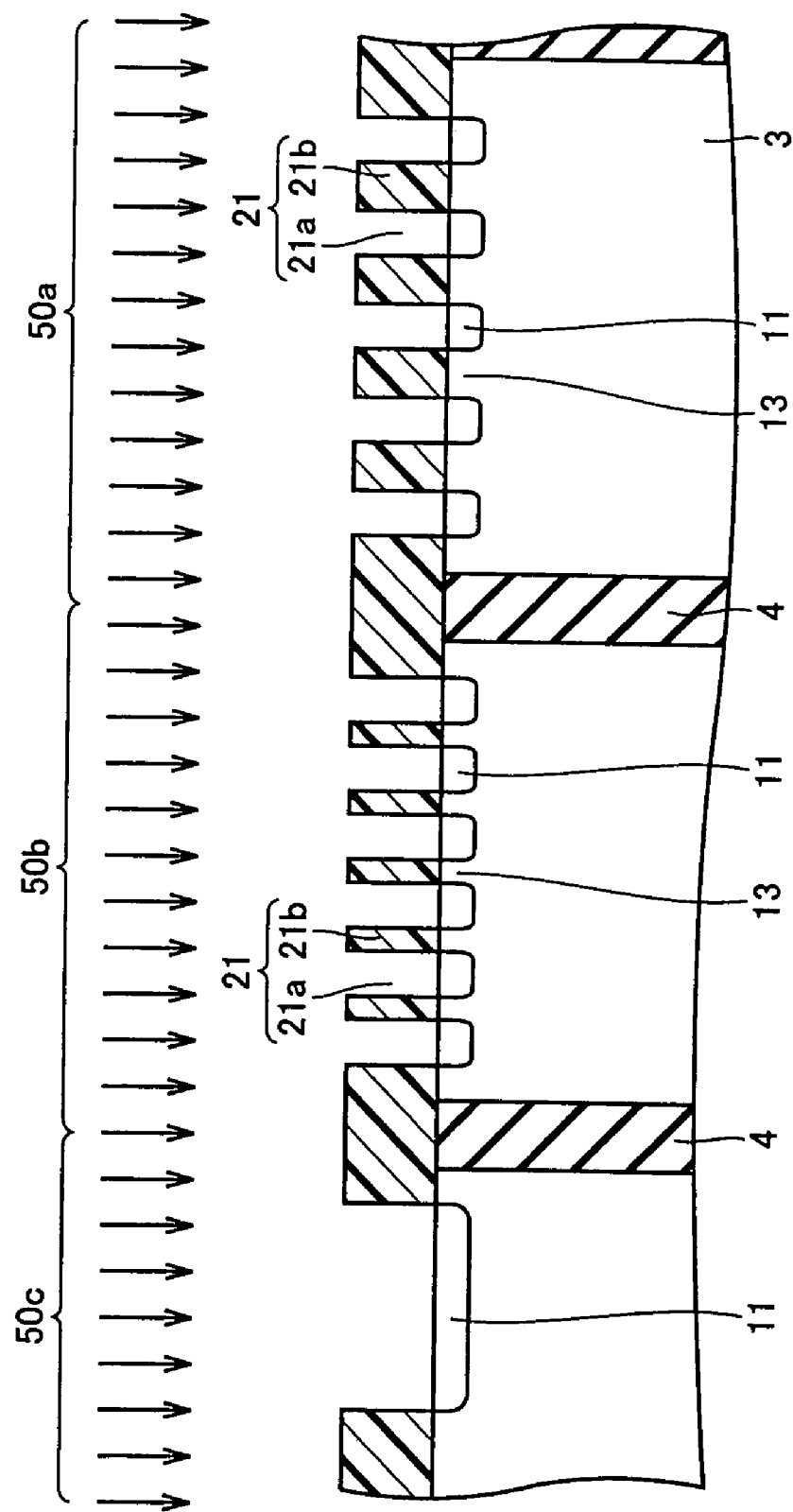
FIG. 14 shows a state in which impurities are implanted according to a method of manufacturing an integrated semiconductor device in a eighth embodiment of the present invention.
Figure 15:
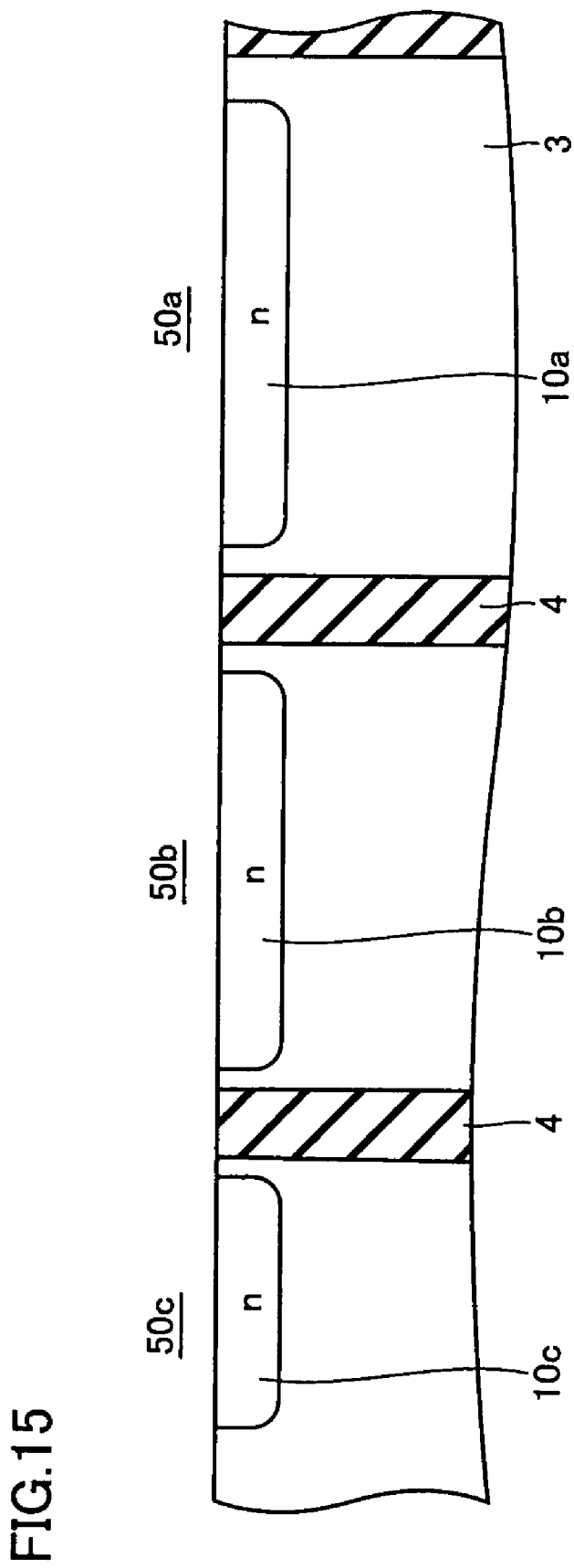
FIG. 15 shows a state in which annealing is performed after the step of impurity implantation shown in FIG. 14.

One feature of an eighth embodiment of the present invention is that the implantation of impurities illustrated in FIG. 6 according to the manufacturing method of the fifth or sixth embodiment is done after formation of a silicon oxide film 4 which isolate transistor element regions from each other (see FIG. 14). Impurity diffusion after isolation of the transistor element regions prevents implanted impurities from entering an adjacent region, and thus a long-term annealing in the annealing process is possible (see FIG. 15). In other words, diffusion for diffusion length L greater than the thickness of n⁻ type drain drift region 3 produces more uniform impurity concentration in the direction of the depth.

In order to produce a uniform impurity concentration in the depth direction by a shorter annealing time, implantation into a deeper position by a high energy for example of at least 1 MeV may be done. Consequently, the impurity concentration in the depth direction can be made uniform by diffusion for a shorter diffusion length L.

Ninth Embodiment

The above-discussed structures and manufacturing methods thereof are applicable to any integrated semiconductor devices each having a plurality of semiconductor elements and for which it is desirable to have different concentrations of respective semiconductor elements. According to a ninth embodiment of the present invention, an integrated semiconductor device is described to which the above structures and manufacturing methods are applicable.

Figure 16:
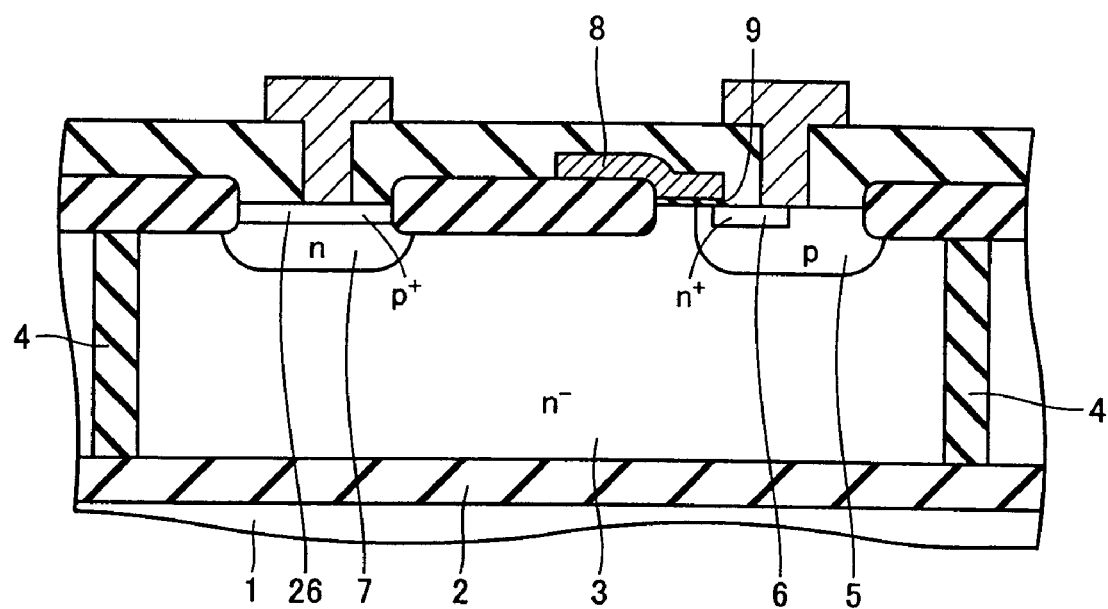
FIG. 16 shows an IGBT according to a ninth embodiment of the present invention.

Examples of the integrated semiconductor device for which it is desirable to have different concentrations of drain regions of semiconductor elements respectively are IGBT (Insulated Gate Bipolar Transistor: bipolar field-effect transistor), npn transistor, pnp transistor, lateral pnp transistor and lateral npn transistor. For these devices, optimization is possible of the effective on-resistance or saturation voltage according to the breakdown voltage level of each semiconductor element, as the nMOS discussed above. In FIG. 16, a p+ type region 26 forming a junction together with a drain convergence region 7 of the IGBT is provided and, in this structure, a depletion layer expands toward drain convergence region 7 by application of a reverse bias voltage. Other components are the same as those in FIG. 1. It is seen from the structure shown in FIG. 16 that the relation between the breakdown voltage and the impurity concentration (on-resistance) of the drain drift region as illustrated in FIG. 1 is directly applicable to the semiconductor device in FIG. 16.

Tenth Embodiment

According to a tenth embodiment of the present invention, a method of manufacturing a transistor with the NMOS structure shown in FIG. 5 and having different distances between the source and the drain convergence region is described. The distance between the source and the drain convergence region has the greatest influence on the breakdown voltage of the transistor. Therefore, the distance is short for a transistor of a low breakdown voltage and is long for a transistor of a high breakdown voltage.

Figure 17:
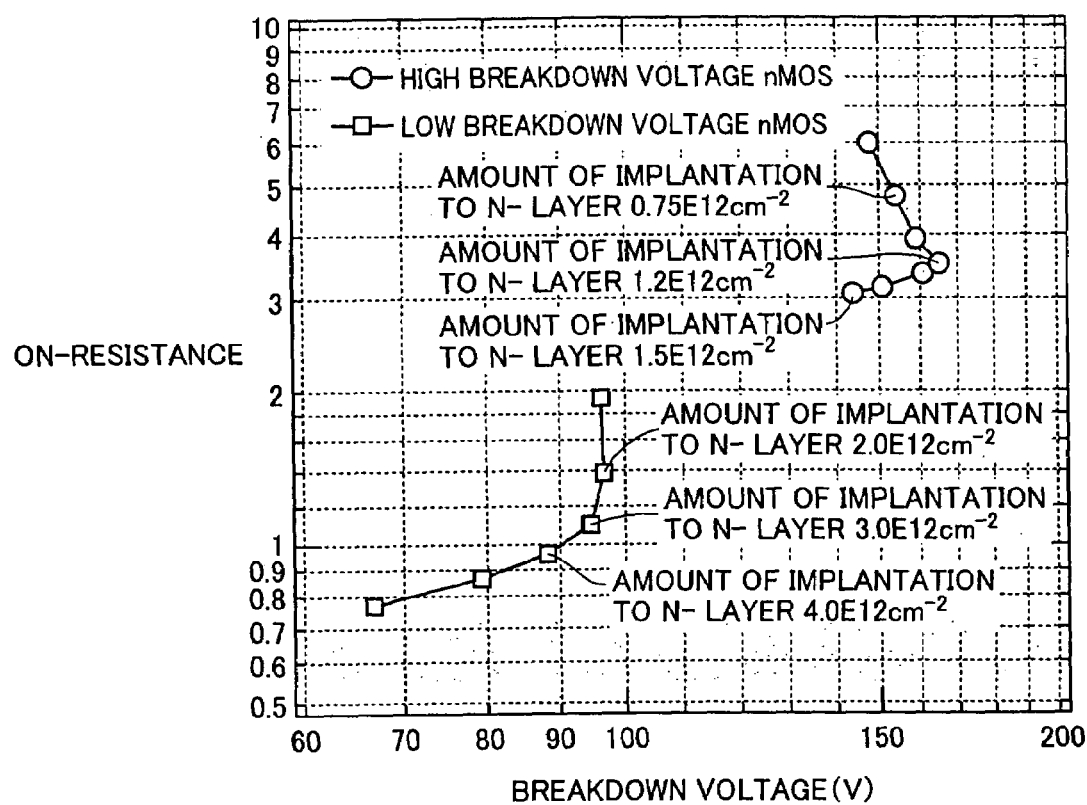
FIG. 17 shows a result of a simulation of a trade-off characteristic between a breakdown voltage and an on-resistance according to a tenth embodiment of the present invention.

FIG. 17 shows the result of a simulation of a trade-off characteristic between the breakdown voltage and the on-resistance of a transistor having $n^-$ type drain drift region 3 formed by phosphorus implantation. For a low-breakdown-voltage nMOS transistor having a short distance between the source and the drain convergence region, the best trade-off characteristic is achieved when the amount of implanted impurities is $3.0E12$ cm$^{-2}$. For a high-breakdown-voltage nMOS transistor having a long distance between the source and the drain, the best trade-off is achieved when the amount of implanted impurities is $1.2E12$ cm$^{-2}$. Therefore, for these transistors having respective breakdown voltages different from each other, phosphorus implantation of $3.0E12$ cm$^{-2}$ for the low-breakdown-voltage transistor and phosphorus implantation of $1.2E12$ cm$^{-2}$ for the high-breakdown-voltage transistor are performed to produce optimum $n^-$ type semiconductor layers respectively of the transistors.

The above-discussed result indicates that, if the distance between the source and the drain convergence region varies, the best trade-off between the breakdown voltage and the on-resistance can be obtained by changing the impurity concentration of the drain drift region according to the distance therebetween. For example, suppose that a plurality of semiconductor elements are divided into two groups with one group having a breakdown voltage of at least 100 V and the other group having a breakdown voltage lower than 100 V. Then, for the semiconductor elements having a breakdown voltage lower than 100 V, a product N·d of the drain drift region can be $1.2\ E12$ cm$^{-2}$. For the semiconductor elements having a breakdown voltage of at least 100 V, a product N·d of the drain drift region can be (at most) in the range from $0.8E12$ cm$^{-2}$ to $1.2\ E12$ cm$^{-2}$ (RESURF condition). In this case, a predetermined breakdown voltage serving as a basis for classifying semiconductor elements is 100 V. Moreover, it is possible to have a product N·d of 12 or more regardless of the breakdown voltage for all of those semiconductor elements.

Eleventh Embodiment

According to an eleventh embodiment of the present invention, a manufacturing method for which the sixth embodiment (FIGS. 6 and 7) is applied to the tenth embodiment (FIG. 17) is described. According to the tenth embodiment, impurity implantation processes have to be done separately for the high breakdown voltage transistor and the low breakdown voltage transistor. Implantation may be performed once instead of the separate impurity implantation processes by application of the fifth and sixth embodiments.

Figure 18:
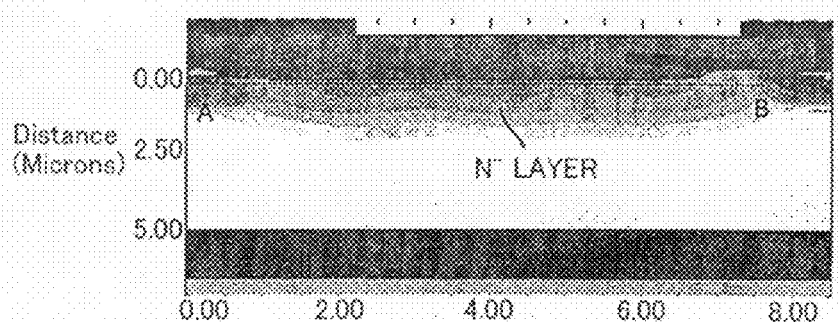
FIG. 18 shows a result of a simulation for a concentration distribution profile of impurities implanted by various implantation masks.
Figure 19:
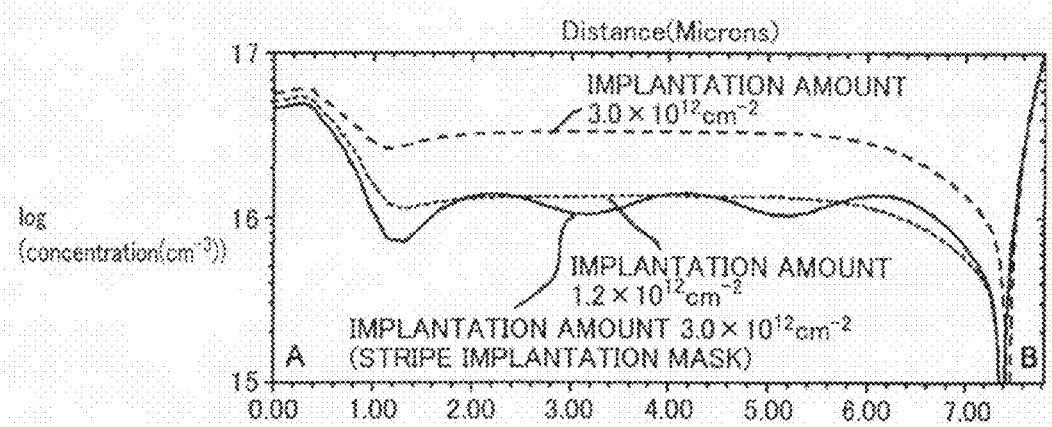
FIG. 19 shows a result of a simulation for a concentration distribution of impurities implanted by various implantation masks.

FIGS. 18 and 19 each show the result of a simulation of phosphorus implantation by means of a stripe mask with an implantation amount of $3.0E12$ cm$^{-2}$ into an nMOS transistor region having a high breakdown voltage. FIG. 18 shows a concentration profile of the cross section and FIG. 19 shows a concentration distribution in the direction of the depth. For the sake of comparison, the result of implantation of phosphorus entirely by an amount of $1.2E12$ cm$^{-2}$ without the stripe mask is plotted in FIG. 19. It is seen from FIG. 19 that the use of the stripe mask can produce an $n^-$ type drain drift region, by the implantation amount of $3.0E12$ cm$^{-2}$, that is almost equivalent to that produced by the implantation amount of $1.2E12$ cm$^{<2}$.

Accordingly, implantation is conducted for the entire region corresponding to the drain drift region of the low-breakdown-voltage nMOS transistor while implantation with the stripe mask is conducted for the region corresponding to the drain drift region of the high-breakdown-voltage NMOS transistor, with an amount of $3.0E12$ cm$^{-2}$. By this implantation performed once, drain drift regions having respective impurity concentrations optimum for the low-breakdown-voltage NMOS transistor and the high-breakdown-voltage nMOS transistor can be formed. Thus, implantation is conducted once to produce an $n^-$ type drain drift region appropriate for the low-breakdown-voltage nMOS transistor and an $n^-$ type semiconductor layer appropriate for the high-breakdown-voltage nMOS transistor as illustrated in connection with the tenth embodiment.

The above method can be used to achieve, for any integrated semiconductor device having semiconductor elements of more various types, an optimum on-resistance for each of the semiconductor elements through one implantation using an implantation mask having different opening ratios for respective semiconductor elements.

Supplemental Remarks on the Embodiments (1) According to the embodiments discussed above, the impurity concentration of the drain drift region and that of the drain drift layer are individually changed. Both of the impurity concentrations, however, may be respectively changed for each of semiconductor elements to adjust the breakdown voltage and the on-resistance.

(2) According to the embodiments discussed above, the drain drift region and the drain drift layer within the drain are used as predetermined regions to change the impurity concentration of the regions according to the type of a semiconductor element. Any region in the drain except for the drain drift region and drain drift layer may be used as a predetermined region for adjusting the impurity concentration.

(3) The impurity concentration in each drain drift region may or may not be rendered uniform by annealing. There may be a concentration gradient. Specifically, the impurity concentration may be high in the surface layer which has a great effect on the on-resistance while the concentration may be lower for a portion deeper in the region. In some cases, concentration gradient is preferable in order to allow each semiconductor element to have a low on-resistance and a high breakdown voltage. In this case, impurity concentrations respectively of drain drift regions of different semiconductor elements are naturally different from each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an integrated semiconductor device having a plurality of semiconductor elements formed in a well region of a semiconductor layer and each having a source of a first-conductivity-type semiconductor, a drain of the first-conductivity-type semiconductor and a body region of a second-conductivity-type semiconductor between said source and said drain, and a lower impurity concentration layer of the first-conductivity-type in an upper region of said well region, comprising the steps of:

implanting impurities concurrently into a first lower impurity concentration layer of one semiconductor element and into a second lower impurity concentration layer of another semiconductor element, an implantation mask being used that includes a portion corresponding to said first lower impurity concentration layer of said one semiconductor element and having a first opening ratio as well as a portion corresponding to said second lower impurity concentration layer of said another semiconductor element and having a second opening ratio different from said first opening ratio, wherein said drain is higher impurity concentration than said lower impurity concentration, said one semiconductor element has a breakdown voltage higher than that of said another semiconductor element, said implantation mask being used has said first opening ratio smaller than said second opening ratio, and said one semiconductor element is adjacent to said another semiconductor element; and providing, in said semiconductor layer, a wall-shaped element-isolation insulating film for isolating said one semiconductor element from said another semiconductor element, prior to said step of implanting impurities; and annealing said integrated semiconductor device after said step of implanting impurities to diffuse said impurities.

2. The method of manufacturing an integrated semiconductor device according to claim 1, wherein said implantation mask has masking portions and openings in the shape of stripes, and said implantation mask is used by being placed with said stripes arranged in the direction parallel to a carrier path from the source to the drain of said semiconductor elements.

3. The method of manufacturing an integrated semiconductor device according to claim 1, wherein said implantation mask being used is a mesh implantation mask having dot-like openings dispersed in a masking portion.

4. The method of manufacturing an integrated semiconductor device according to claim 1, wherein said implantation mask being used is a dot implantation mask having dot-like masking portions dispersed in an opening.

5. The method of manufacturing an integrated semiconductor device according to claim 1, wherein an impurity concentration of said first lower impurity concentration layer is lower than said second lower impurity concentration layer.

* * * * *